United States Patent
Kudou et al.

(10) Patent No.: US 10,600,904 B2
(45) Date of Patent: Mar. 24, 2020

(54) SEMICONDUCTOR DEVICE

(71) Applicant: Renesas Electronics Corporation, Koutou-ku, Tokyo (JP)

(72) Inventors: Hiroyoshi Kudou, Hitachinaka (JP); Satoru Tokuda, Hitachinaka (JP); Satoshi Uchiya, Hitachinaka (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/956,611

(22) Filed: Apr. 18, 2018

(65) Prior Publication Data

US 2018/0366575 A1 Dec. 20, 2018

(30) Foreign Application Priority Data

Jun. 15, 2017 (JP) ................................. 2017-117572

(51) Int. Cl.
| | |
|---|---|
| *H01L 29/78* | (2006.01) |
| *H01L 29/66* | (2006.01) |
| *H01L 23/482* | (2006.01) |
| *H01L 29/423* | (2006.01) |

(52) U.S. Cl.
CPC ...... *H01L 29/7813* (2013.01); *H01L 23/4824* (2013.01); *H01L 29/42368* (2013.01); *H01L 29/66734* (2013.01); *H01L 29/7803* (2013.01)

(58) Field of Classification Search
None
See application file for complete search history.

(56) References Cited

U.S. PATENT DOCUMENTS

| | | | |
|---|---|---|---|
| 5,998,833 A | 12/1999 | Baliga | |
| 8,258,555 B2* | 9/2012 | Lin | ................. H01L 29/66727 257/288 |
| 9,954,095 B2* | 4/2018 | Moriya | ............ H01L 21/76897 |
| 2009/0242977 A1 | 10/2009 | Kawaguchi et al. | |
| 2012/0049263 A1* | 3/2012 | Lin | ................. H01L 29/66727 257/306 |
| 2017/0263753 A1* | 9/2017 | Moriya | ............ H01L 21/76897 |

FOREIGN PATENT DOCUMENTS

JP 2009-260271 A 11/2009

* cited by examiner

*Primary Examiner* — Telly D Green
(74) *Attorney, Agent, or Firm* — SGPatents PLLC

(57) ABSTRACT

A semiconductor device according to one embodiment includes: a semiconductor substrate having a first surface and a second surface which is an opposite surface of the first surface; a first wiring and a second wiring disposed on the first surface; a first conductive film electrically connected to the first wiring; and a gate electrode. The semiconductor substrate has a source region, a drain region, a drift region, and a body region. The drift region is disposed so as to surround the body region in a plan view. The first wiring has a first portion disposed so as to extend across a boundary between the drift region and the body region in a plan view, and electrically connected to the drift region. The second wiring is electrically connected to the source region. The first conductive film is insulated from and faces the second wiring.

12 Claims, 15 Drawing Sheets

SEMICONDUCTOR DEVICE

This nonprovisional application is based on Japanese Patent Application No. 2017-117572 filed on Jun. 15, 2017 with the Japan Patent Office, the entire contents of which are hereby incorporated by reference.

BACKGROUND OF THE INVENTION

Field of the Invention

The present invention relates to a semiconductor device.

Description of the Background Art

Conventionally, a trench-gate-type and vertical MOSFET (Metal Oxide Semiconductor Field Effect Transistor) has, for example, been known as a power semiconductor device.

When noise occurs in such a trench-gate-type and vertical MOSFET, the noise passes through a junction capacitance of a p-n junction formed between a drift region and a base region. However, when the noise has a low frequency, an impedance of the junction capacitance increases. This causes a problem of making it difficult for the noise to pass through the junction capacitance.

As a semiconductor device for addressing this problem, a semiconductor device described in Japanese Patent Laying-Open No. 2009-260271 (PTD 1) and a semiconductor device described in U.S. Pat. No. 5,998,833 (PTD 2) have been proposed.

A semiconductor substrate of the semiconductor device described in PTD 1 has a trench MOS region in which a trench-type and vertical MOSFET is formed, and a capacitance forming region. In the capacitance forming region, the semiconductor substrate has a trench formed to extend from a main surface toward a rear surface side in a drift region, an insulating film formed on a surface of the trench, and a conductive film formed on the insulating film. The conductive film has a source potential. Therefore, a source-drain capacitance is formed between the conductive film and the drift region.

The semiconductor device described in PTD 2 has, in a semiconductor substrate, a gate electrode being insulated from and facing a base region of a portion sandwiched between a source region and a drift region, and a conductive film being insulated from and facing the drift region. The gate electrode and the conductive film are formed in a trench formed to extend from a main surface toward a rear surface side of the semiconductor substrate. The conductive film has a source potential and is disposed closer to the rear surface than the gate electrode. Therefore, a source-drain capacitance is formed between the conductive film and the drift region.

SUMMARY OF THE INVENTION

According to the semiconductor devices described in PTD 1 and PTD 2, the additional capacitance is formed between the source and the drain, and thus, an influence of noise is reduced. However, the semiconductor device described in PTD 1 has a problem of an increase in chip area.

The semiconductor device described in PTD 2 has a problem of complication of a process as compared with a common trench-gate-type and vertical MOSFET, because the trench needs to be formed deeply and formation of an insulating film in the trench and etching need to be repeated a plurality of times.

The other problems and novel features will become apparent from the description of the specification and the accompanying drawings.

A semiconductor device according to one embodiment includes: a semiconductor substrate having a first surface and a second surface which is an opposite surface of the first surface; a first wiring and a second wiring disposed on the first surface; a first conductive film electrically connected to the first wiring; and a gate electrode. The semiconductor substrate has a source region of a first conductivity type located in the first surface, a drain region of the first conductivity type located in the second surface, a drift region of the first conductivity type located on the drain region, and a body region of a second conductivity type sandwiched between the source region and the drift region, the second conductivity type being a conductivity type opposite to the first conductivity type. The drift region is disposed so as to surround the body region in a plan view. The first wiring has a first portion disposed so as to extend across a boundary between the drift region and the body region in a plan view, and electrically connected to the drift region. The gate electrode is insulated from and faces the body region sandwiched between the source region and the drift region. The second wiring is electrically connected to the source region. The first conductive film is insulated from and faces the second wiring.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
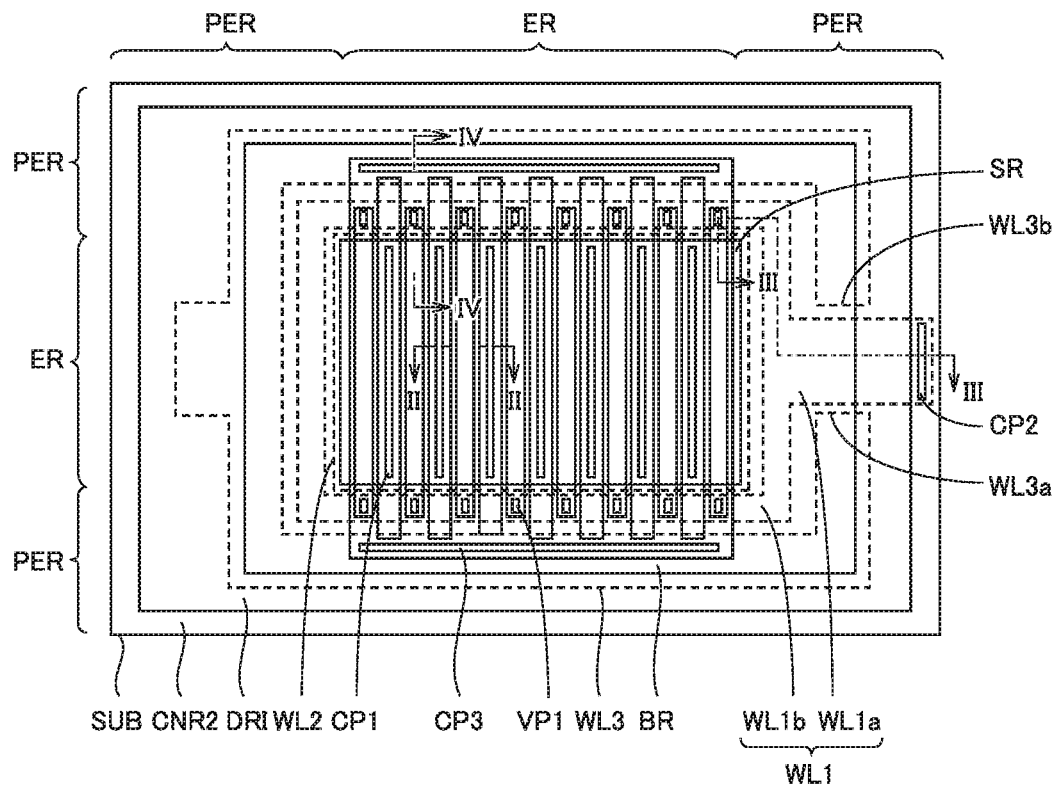
FIG. 1 is a plan view of a semiconductor device according to a first embodiment.
Figure 2:
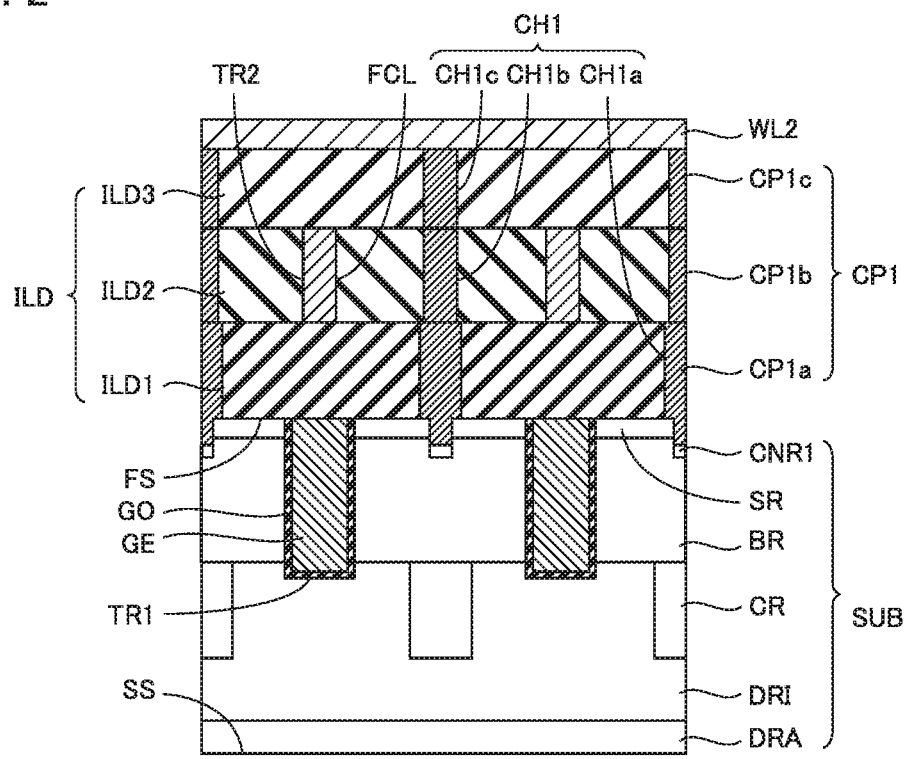
FIG. 2 is a cross-sectional view taken along line II-II in FIG. 1.
Figure 3:
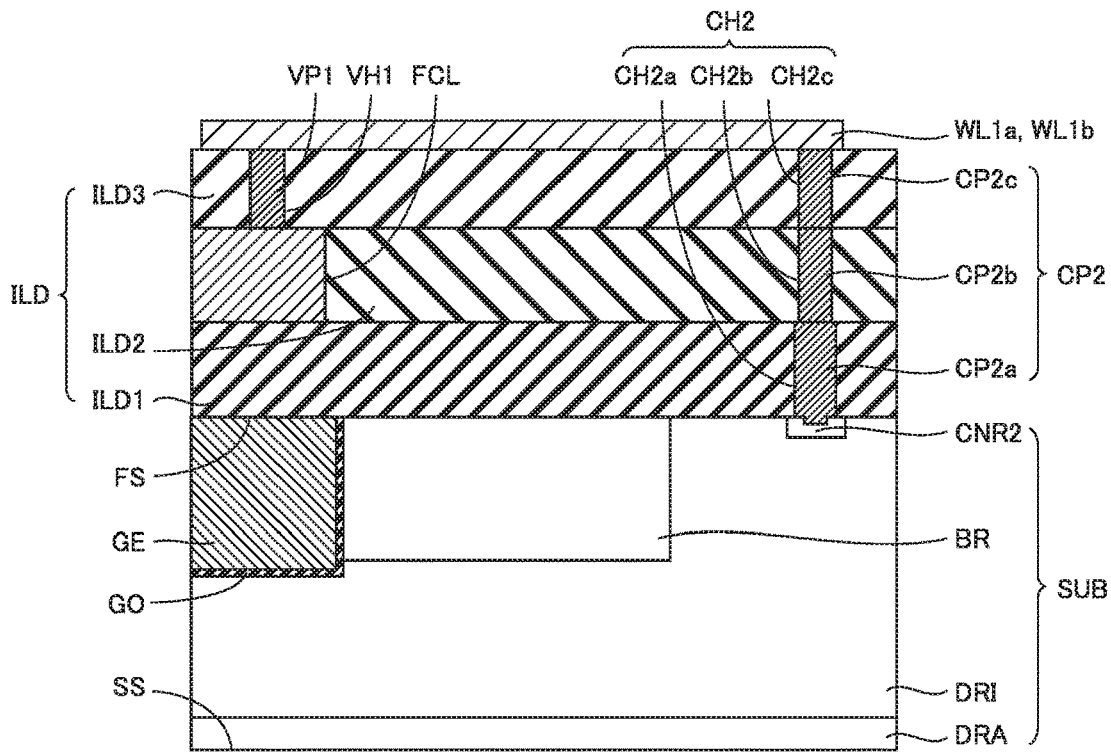
FIG. 3 is a cross-sectional view taken along line in III-III FIG. 1.
Figure 4:
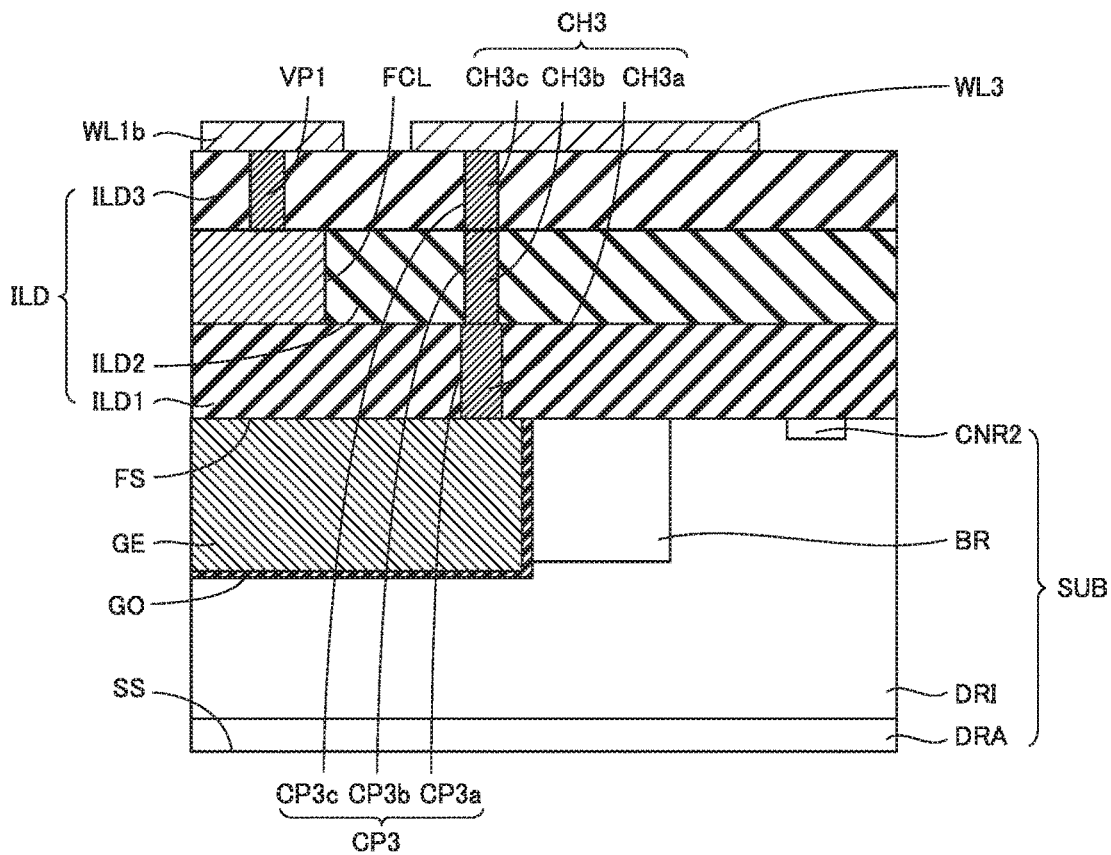
FIG. 4 is a cross-sectional view taken along line IV-IV in FIG. 1.

Embodiments will be described hereinafter with reference to the drawings. In the drawings below, the same or corresponding portions are denoted by the same reference numerals and description thereof will not be repeated.

First Embodiment

A structure of a semiconductor device according to a first embodiment will be described below.

As shown in FIGS. 1, 2, 3, and 4, the semiconductor device according to the first embodiment has a semiconductor substrate SUB, a gate insulating film GO, a gate electrode GE, an interlayer insulating film ILD, a contact plug CP1, a contact plug CP2, a contact plug CP3, a first conductive film FCL, a first wiring WL1, a second wiring WL2, and a third wiring WL3.

Semiconductor substrate SUB has an element region ER and an outer peripheral region PER. Outer peripheral region PER is located in an outer peripheral portion of semiconductor substrate SUB. Element region ER is a region inside a boundary between a source region SR and a body region BR in a plan view. Semiconductor substrate SUB has a first surface FS and a second surface SS. Second surface SS is an opposite surface of first surface FS. Semiconductor substrate SUB is made of, for example, monocrystalline silicon (Si). However, the material of semiconductor substrate SUB is not limited to monocrystalline silicon.

Semiconductor substrate SUB has source region SR, a drain region DRA, a drift region DRI, and body region BR. Semiconductor substrate SUB may have a contact region CNR1, a contact region CNR2 and a column region CR.

A conductivity type of source region SR is a first conductivity type. A conductivity type of drain region DRA is the first conductivity type. A conductivity type of drift region DRI is the first conductivity type. A conductivity type of body region BR is a second conductivity type. A conductivity type of contact region CNR1 is the second conductivity type. A conductivity type of contact region CNR2 is the first conductivity type. A conductivity type of column region CR is the second conductivity type.

The second conductivity type is a conductivity type opposite to the first conductivity type. For example, when the first conductivity type is an n type, the second conductivity type is a p type. In this case, the regions of semiconductor substrate SUB having the first conductivity type (source region SR, drain region DRA, drift region DRI, and contact region CNR2) include an acceptor element such as phosphorus (P) or arsenic (As) as an impurity. The regions of semiconductor substrate SUB having the second conductivity type (body region BR, contact region CNR1 and column region CR) include an acceptor element such as boron (B) or aluminum (Al) as an impurity.

An impurity concentration of drift region DRI is preferably lower than an impurity concentration of source region SR and drain region DRA. An impurity concentration of contact region CNR1 is preferably higher than an impurity concentration of body region BR. An impurity concentration of contact region CNR2 is preferably higher than an impurity concentration of drift region DRI.

Source region SR is disposed in first surface FS. Drain region DRA is disposed in second surface SS. Drift region DRI is disposed on drain region DRA. More specifically, drift region DRI is disposed on a surface of drain region DRA on the first surface FS side. Body region BR is sandwiched between source region SR and drift region DRI. Contact region CNR1 is disposed in first surface FS. Contact region CNR1 is surrounded by body region BR.

Source region SR is surrounded by body region BR in a plan view (as viewed from a direction orthogonal to first surface FS). Body region BR is surrounded by drift region DRI in a plan view. Source region SR is disposed in element region ER in a plan view. Body region BR and drift region DRI are disposed so as to reach outer peripheral region PER in a plan view. Contact region CNR2 is disposed in first surface FS located in outer peripheral region PER. Contact region CNR2 is surrounded by drift region DRI. Column region CR is disposed in drift region DRI. Column region CR extends from body region BR toward the second surface SS side.

A trench TR1 is provided in first surface FS. Trench TR1 extends from first surface FS toward second surface SS. Trench TR1 reaches drift region DRI. From another point of view, source region SR, body region BR and drift region DRI are exposed from a side wall of trench TR1.

Gate insulating film GO is disposed on the side wall and a bottom wall of trench TR1. Gate insulating film GO is made of, for example, silicon dioxide ($SiO_2$). Gate electrode GE is disposed on gate insulating film GO. Gate electrode GE is embedded in trench TR1. That is, gate electrode GE is insulated from and faces body region BR sandwiched between source region SR and drift region DRI. Gate electrode GE is made of, for example, polycrystalline Si doped with an impurity element. Gate electrode GE is preferably disposed in a comb shape in a plan view.

Interlayer insulating film ILD is disposed on first surface FS. Interlayer insulating film ILD has a first interlayer insulating film ILD1, a second interlayer insulating film ILD2 and a third interlayer insulating film ILD3. Second interlayer insulating film ILD2 is disposed on first interlayer insulating film ILD1. Third interlayer insulating film ILD3 is disposed on second interlayer insulating film ILD2. Interlayer insulating film ILD is made of, for example, $SiO_2$. More specifically, first interlayer insulating film ILD1 is made of BPSG (Boron Phosphorous Silicate Glass). Second interlayer insulating film ILD2 and third interlayer insulating film ILD3 are made of p-$SiO_2$.

A contact hole CH1, a contact hole CH2 and a contact hole CH3 are provided in interlayer insulating film ILD. Contact hole CH1, contact hole CH2 and contact hole CH3 penetrate through interlayer insulating film ILD in a thickness direction.

Contact hole CH1 has a first portion CH1*a*, a second portion CH1*b* and a third portion CH1*c*. First portion CH1*a* is located in first interlayer insulating film ILD1. Source region SR and contact region CNR1 are exposed from first portion CH1*a*. Second portion CH1*b* is located in second interlayer insulating film ILD2. Third portion CH1*c* is located in third interlayer insulating film ILD3.

Contact hole CH2 has a first portion CH2*a*, a second portion CH2*b* and a third portion CH2*c*. First portion CH2*a* is located in first interlayer insulating film ILD1. Contact region CNR2 is exposed from first portion CH2*a*. Second portion CH2*b* is located in second interlayer insulating film ILD2. Third portion CH2*c* is located in third interlayer insulating film ILD3.

Contact hole CH3 has a first portion CH3*a*, a second portion CH3*b* and a third portion CH3*c*. First portion CH3*a* is located in first interlayer insulating film ILD1. Gate electrode GE is exposed from first portion CH3*a*. Second portion CH3*b* is located in second interlayer insulating film ILD2. Third portion CH3*c* is located in third interlayer insulating film ILD3.

Contact plug CP1 electrically connects second wiring WL2 and source and body regions SR and BR. Contact plug CP1 has a first portion CP1*a* disposed in first portion CH1*a*, a second portion CP1*b* disposed in second portion CH1*b*, and a third portion CP1*c* disposed in third portion CH1*c*.

Contact plug CP2 electrically connects first wiring WL1 (first portion WL1*a*) and contact region CNR2. As a result, first wiring WL1 is electrically connected to drift region DRI and drain region DRA. Contact plug CP2 has a first portion CP2*a* disposed in first portion CH2*a*, a second portion CP2*b* disposed in second portion CH2*b*, and a third portion CP2*c* disposed in third portion CH2*c*.

Contact plug CP3 electrically connects third wiring WL3 and gate electrode GE. Contact plug CP3 has a first portion CP3*a* disposed in first portion CH3*a*, a second portion CP3*b* disposed in second portion CH3*b*, and a third portion CP3*c* disposed in third portion CH3*c*.

Contact plug CP1, contact plug CP2 and contact plug CP3 are made of, for example, tungsten (W).

A trench TR2 is provided in second interlayer insulating film ILD2. Trench TR2 extends from a surface of second interlayer insulating film ILD2 on the third interlayer insulating film ILD3 side toward a surface of second interlayer insulating film ILD2 on the first interlayer insulating film ILD1 side. Trench TR2 may penetrate through second interlayer insulating film ILD2 in the thickness direction. First conductive film FCL is embedded in trench TR2. A material of first conductive film FCL is preferably identical to the material of contact plug CP1, contact plug CP2 and contact plug CP3. That is, first conductive film FCL is made of, for example, W. First conductive film FCL is insulated from and faces contact plug CP1 and second wiring WL2 by interlayer insulating film ILD. First conductive film FCL is disposed in element region ER in a plan view. First conductive film FCL is disposed so as to overlap with second wiring WL2 in a plan view. First conductive film FCL is preferably disposed so as to traverse source region SR in a plan view. First conductive film FCL is preferably disposed so as to overlap with gate electrode GE in a plan view.

First wiring WL1 is disposed on first surface FS. First wiring WL1 is disposed on interlayer insulating film ILD. More specifically, first wiring WL1 is disposed on third interlayer insulating film ILD3. First wiring WL1 has first portion WL1*a* and a second portion WL1*b*. First portion WL1*a* is disposed so as to extend across a boundary between body region BR and drift region DRI in a plan view. Second portion WL1*b* is disposed so as to surround source region SR in a plan view.

First wiring WL1 is disposed on third interlayer insulating film ILD3, while first conductive film FCL is disposed in second interlayer insulating film ILD2. Therefore, a distance between first wiring WL1 (first portion WL1*a*) and first surface FS is greater than a distance between first conductive film FCL and first surface FS.

Second wiring WL2 is disposed on first surface FS. Second wiring WL2 is disposed on interlayer insulating film ILD. More specifically, second wiring WL2 is disposed on third interlayer insulating film ILD3. Second wiring WL2 is disposed so as to overlap with source region SR in a plan view.

Third wiring WL3 is disposed on first surface FS. Third wiring WL3 is disposed on interlayer insulating film ILD. More specifically, third wiring WL3 is disposed on third interlayer insulating film ILD3. Third wiring WL3 has a third end WL3*a* and a fourth end WL3*b*. Third end WL3*a* and fourth end WL3*b* are spaced apart from each other. Third wiring WL3 is disposed so as to extend across the boundary between body region BR and drift region DRI in a plan view. Third wiring WL3 extends from third end WL3*a* toward fourth end WL3*b*. Third wiring WL3 preferably extends along the boundary between body region BR and drift region DRI. First portion WL1*a* passes between third end WL3*a* and fourth end WL3*b*.

First wiring WL1, second wiring WL2 and third wiring WL3 are made of, for example, aluminum (Al), an Al alloy or the like.

A via hole VH1 is provided in third interlayer insulating film ILD3. Via hole VH1 penetrates through third interlayer insulating film ILD3 in the thickness direction. A via plug VP1 is disposed in via hole VH1. Via plug VP1 electrically connects first wiring WL1 (second portion WL1*b*) and first conductive film FCL. As described above, first wiring WL1 is electrically connected to drain region DRA. Therefore, first conductive film FCL is electrically connected to drain region DRA. Via plug VP1 is made of, for example, W.

Figure 5:
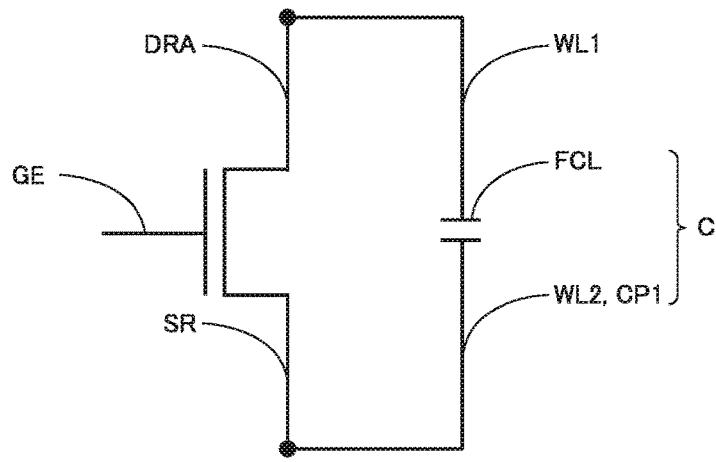
FIG. 5 is an equivalent circuit diagram of the semiconductor device according to the first embodiment.

As described above, first conductive film FCL is electrically connected to drain region DRA, and is insulated from and faces second wiring WL2 (and contact plug CP1). Therefore, as shown in FIG. 5, in the semiconductor device according to the first embodiment, first conductive film FCL as well as second wiring WL2 and contact plug CP1 form a source-drain capacitance C.

A method for manufacturing the semiconductor device according to the first embodiment will be described below.

Figure 6:
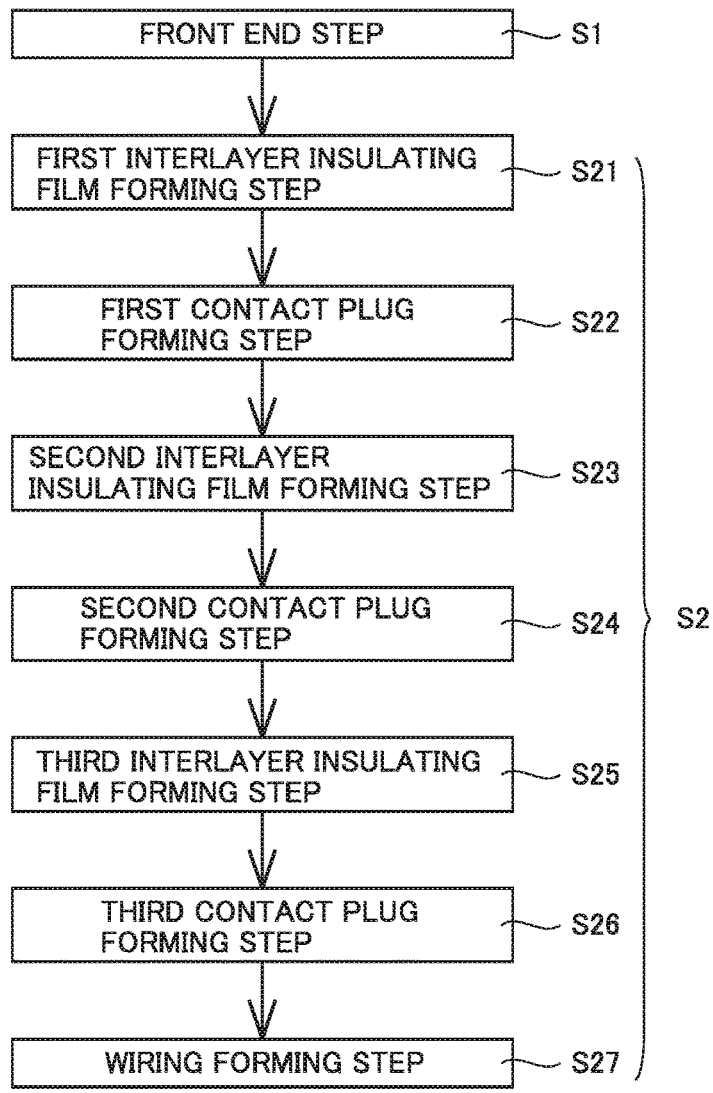
FIG. 6 is a process chart showing a method for manufacturing the semiconductor device according to the first embodiment.
Figure 7:
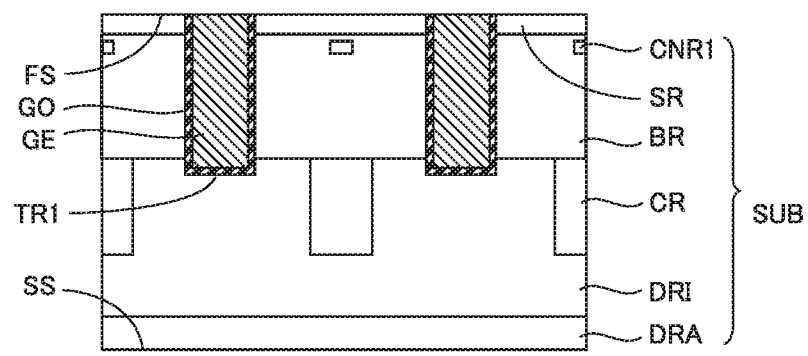
FIG. 7 is a cross-sectional view of the semiconductor device according to the first embodiment in an element region in a front end step.
Figure 8:
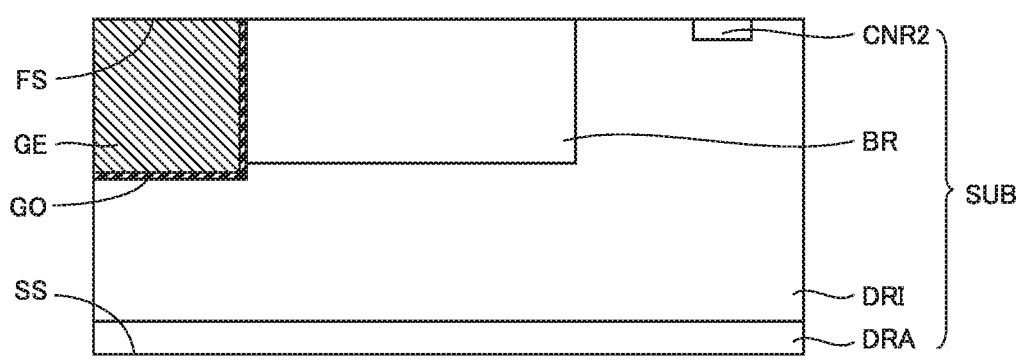
FIG. 8 is a cross-sectional view of the semiconductor device according to the first embodiment in an outer peripheral region in the front end step.

As shown in FIG. 6, the method for manufacturing the semiconductor device according to the first embodiment has a front end step S1 and a back end step S2. In front end step S1, semiconductor substrate SUB, gate insulating film GO and gate electrode GE are formed as shown in FIGS. 7 and 8.

Drift region DRI is formed by, for example, epitaxial growth. Body region BR, source region SR, contact region CNR1, contact region CNR2, and column region CR are formed by, for example, ion implantation. Trench TR1 is formed by, for example, anisotropic etching such as RIE (Reactive Ion Etching). Gate insulating film GO is formed by, for example, thermal oxidation. Gate electrode GE is formed by, for example, CVD.

Back end step S2 has a first interlayer insulating film forming step S21, a first contact plug forming step S22, a second interlayer insulating film forming step S23, a second contact plug forming step S24, a third interlayer insulating film forming step S25, a third contact plug forming step S26, and a wiring forming step S27.

Figure 9:
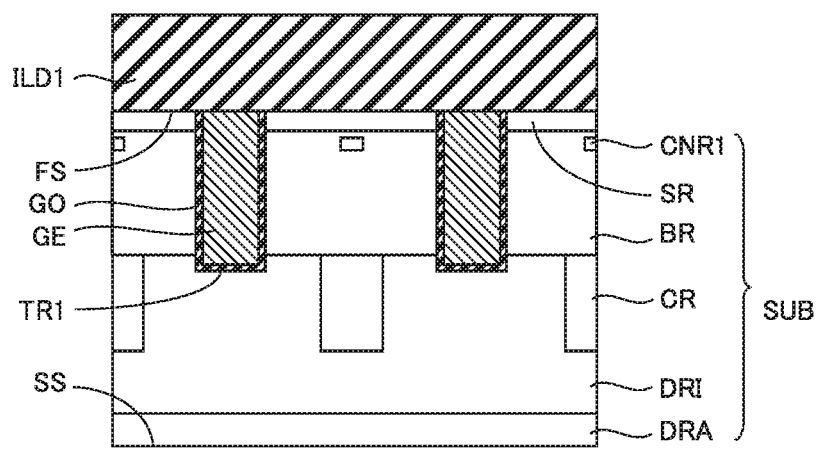
FIG. 9 is a cross-sectional view of the semiconductor device according to the first embodiment in the element region in a first interlayer insulating film forming step.
Figure 10:
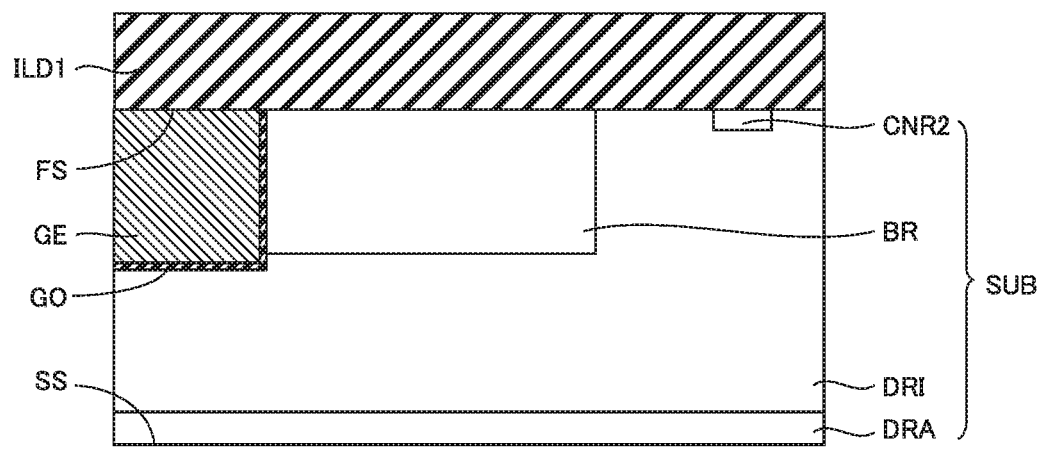
FIG. 10 is a cross-sectional view of the semiconductor device according to the first embodiment in the outer peripheral region in the first interlayer insulating film forming step.

As shown in FIGS. 9 and 10, in first interlayer insulating film forming step S21, first interlayer insulating film ILD1 is formed. First interlayer insulating film ILD1 is formed by, for example, CVD (Chemical Vapor Deposition).

Figure 11:
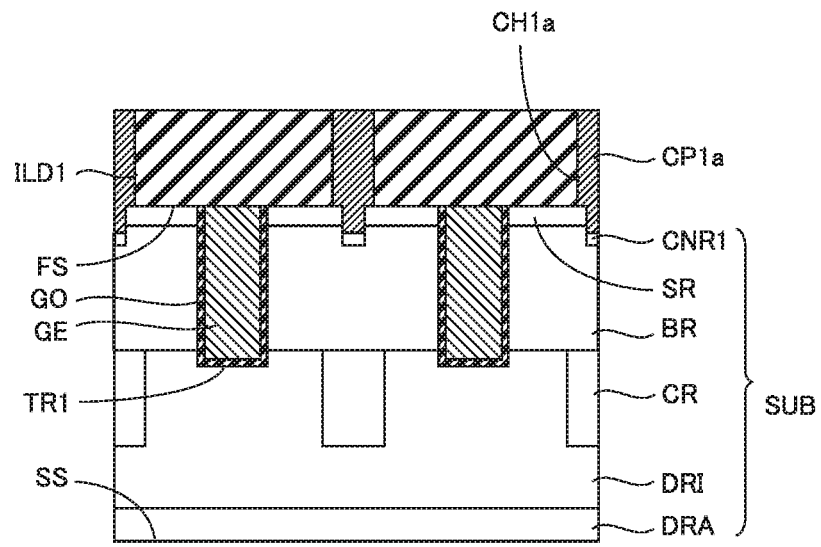
FIG. 11 is a cross-sectional view of the semiconductor device according to the first embodiment in the element region in a first contact plug forming step.
Figure 12:
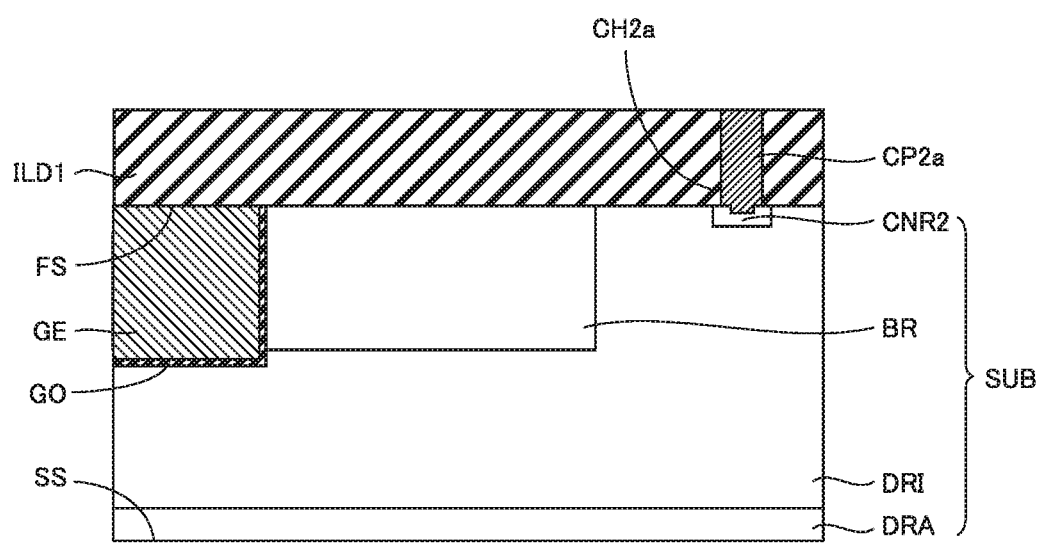
FIG. 12 is a cross-sectional view of the semiconductor device according to the first embodiment in the outer peripheral region in the first contact plug forming step.

As shown in FIGS. 11 and 12, in first contact plug forming step S22, first portion CP1a and first portion CP2a are formed. Although not shown in FIGS. 11 and 12, first portion CP3a is also formed in first contact plug forming step S22.

In first contact plug forming step S22, first portion CH1a, first portion CH2a and first portion CH3a are first formed by performing anisotropic etching such as RIE on first interlayer insulating film ILD1. Secondly, the materials forming first portion CP1a, first portion CP2a and first portion CP3a are embedded in first portion CH1a, first portion CH2a and first portion CH3a by, for example, CVD.

Thirdly, the materials forming first portion CP1a, first portion CP2a and first portion CP3a that have overflowed from first portion CH1a, first portion CH2a and first portion CH3a are removed by, for example, CMP (Chemical Mechanical Polishing). First portion CP1a, first portion CP2a and first portion CP3a are thus formed.

Figure 13:
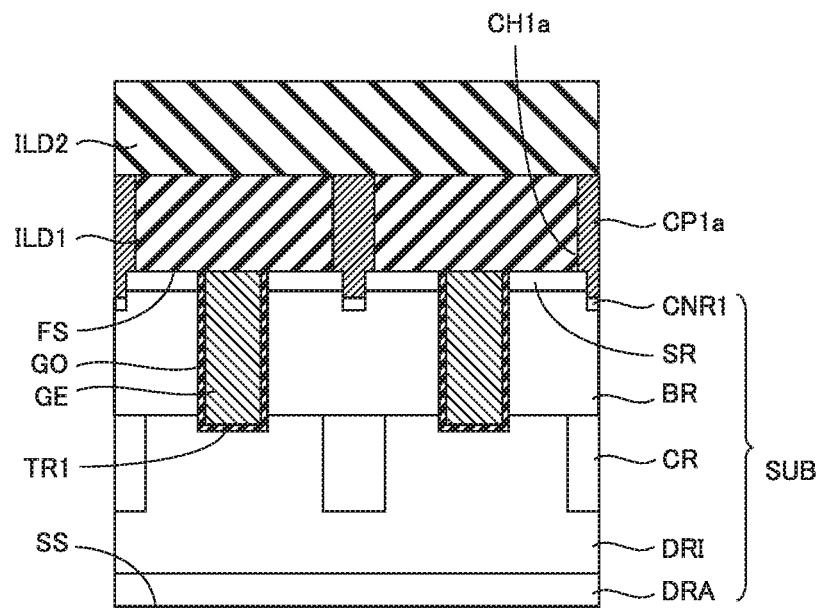
FIG. 13 is a cross-sectional view of the semiconductor device according to the first embodiment in the element region in a second interlayer insulating film forming step.
Figure 14:
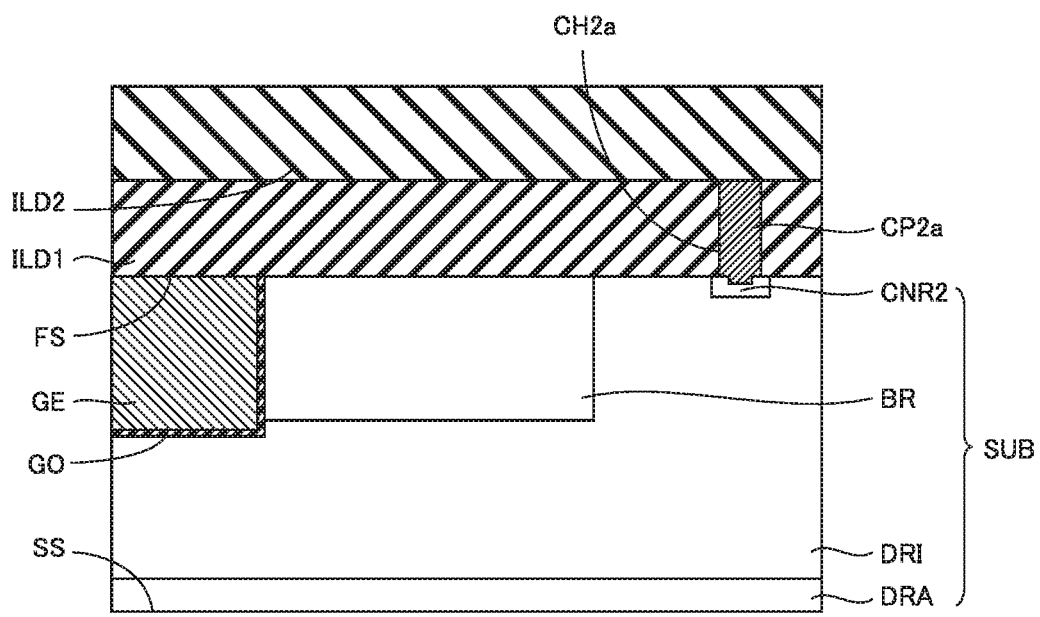
FIG. 14 is a cross-sectional view of the semiconductor device according to the first embodiment in the outer peripheral region in the second interlayer insulating film forming step.

As shown in FIGS. 13 and 14, in second interlayer insulating film forming step S23, second interlayer insulating film ILD2 is formed. Second interlayer insulating film ILD2 is formed by, for example, CVD.

Figure 15:
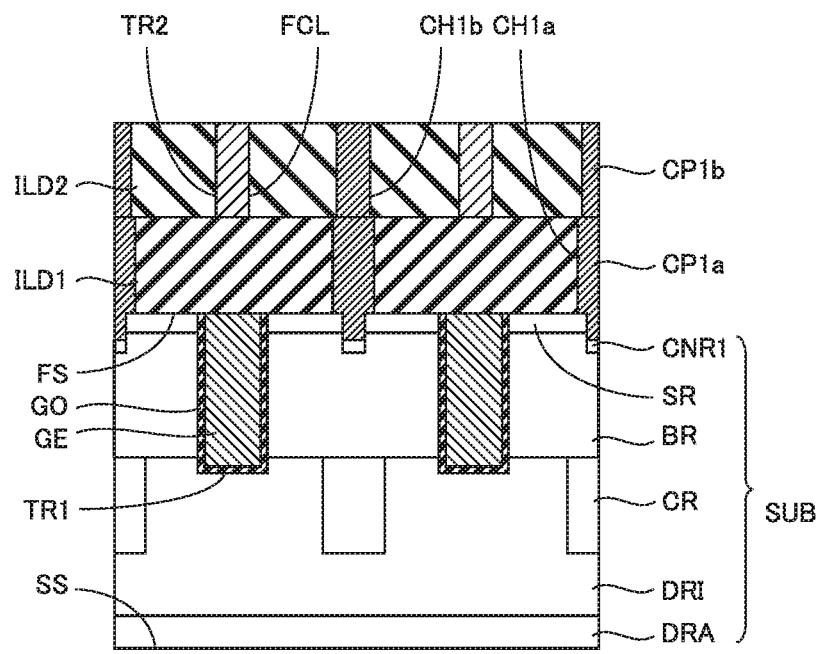
FIG. 15 is a cross-sectional view of the semiconductor device according to the first embodiment in the element region in a second contact plug forming step.
Figure 16:
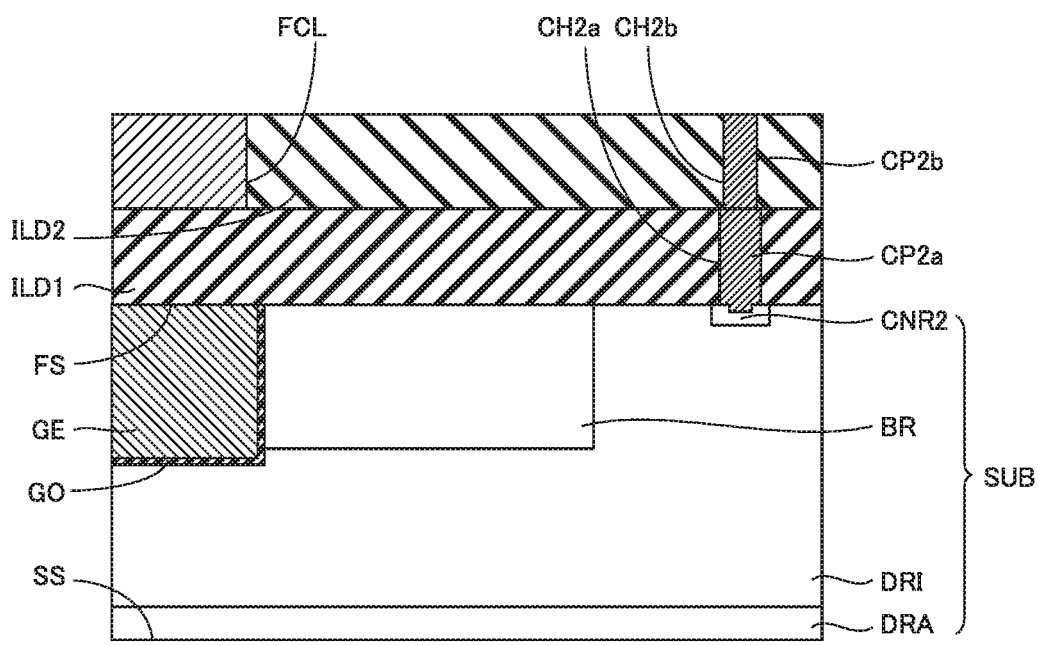
FIG. 16 is a cross-sectional view of the semiconductor device according to the first embodiment in the outer peripheral region in the second contact plug forming step.

As shown in FIGS. 15 and 16, in second contact plug forming step S24, second portion CP1b, second portion CP2b and first conductive film FCL are formed. Although not shown in FIGS. 15 and 16, second portion CP3b is also formed in second contact plug forming step S24.

In second contact plug forming step S24, second portion CH1b, second portion CH2b, second portion CH3b, and trench TR2 are first formed by performing anisotropic etching such as RIE on second interlayer insulating film ILD2. Secondly, the materials forming second portion CP1b, second portion CP2b, second portion CP3b, and first conductive film FCL are embedded in second portion CH1b, second portion CH2b, second portion CH3b, and trench TR2 by, for example, CVD.

Thirdly, the materials forming second portion CP1b, second portion CP2b, second portion CP3b, and first conductive film FCL that have overflowed from second portion CH1b, second portion CH2b, second portion CH3b, and trench TR2 are removed by, for example, CMP. Second portion CP1b, second portion CP2b, second portion CP3b, and first conductive film FCL are thus formed.

Figure 17:
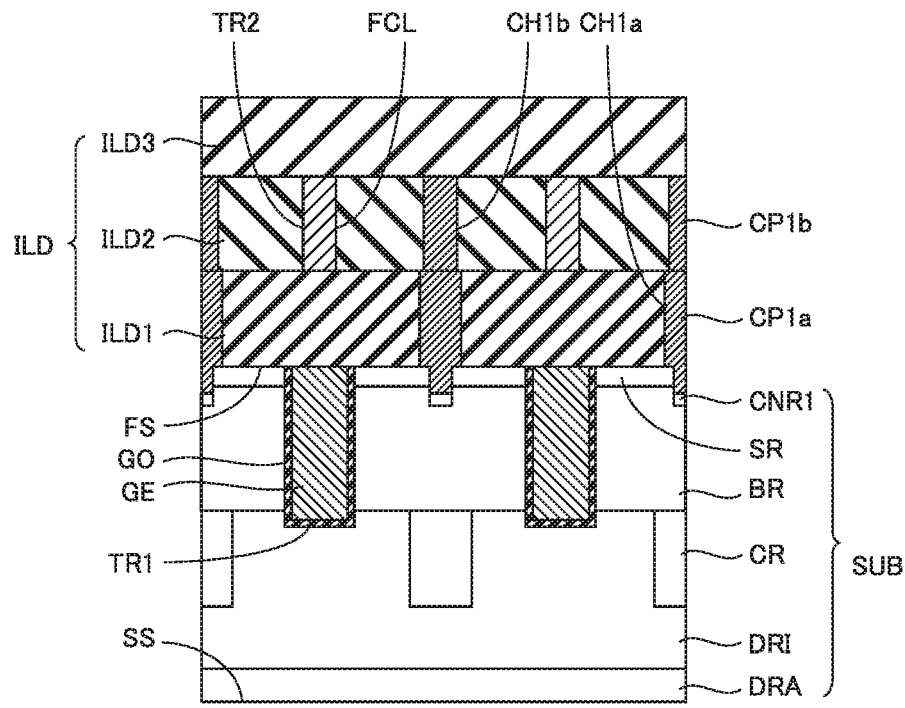
FIG. 17 is a cross-sectional view of the semiconductor device according to the first embodiment in the element region in a third interlayer insulating film forming step.
Figure 18:
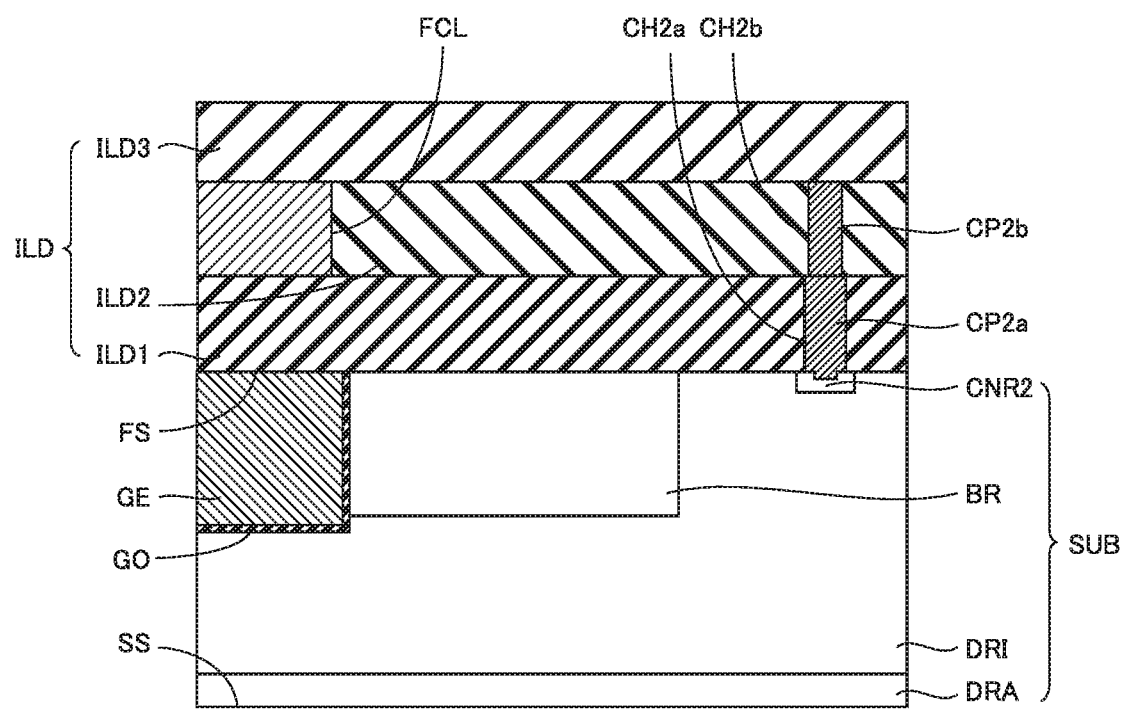
FIG. 18 is a cross-sectional view of the semiconductor device according to the first embodiment in the outer peripheral region in the third interlayer insulating film forming step.

As shown in FIGS. 17 and 18, in third interlayer insulating film forming step S25, third interlayer insulating film ILD3 is formed. Third interlayer insulating film ILD3 is formed by, for example, CVD.

Figure 19:
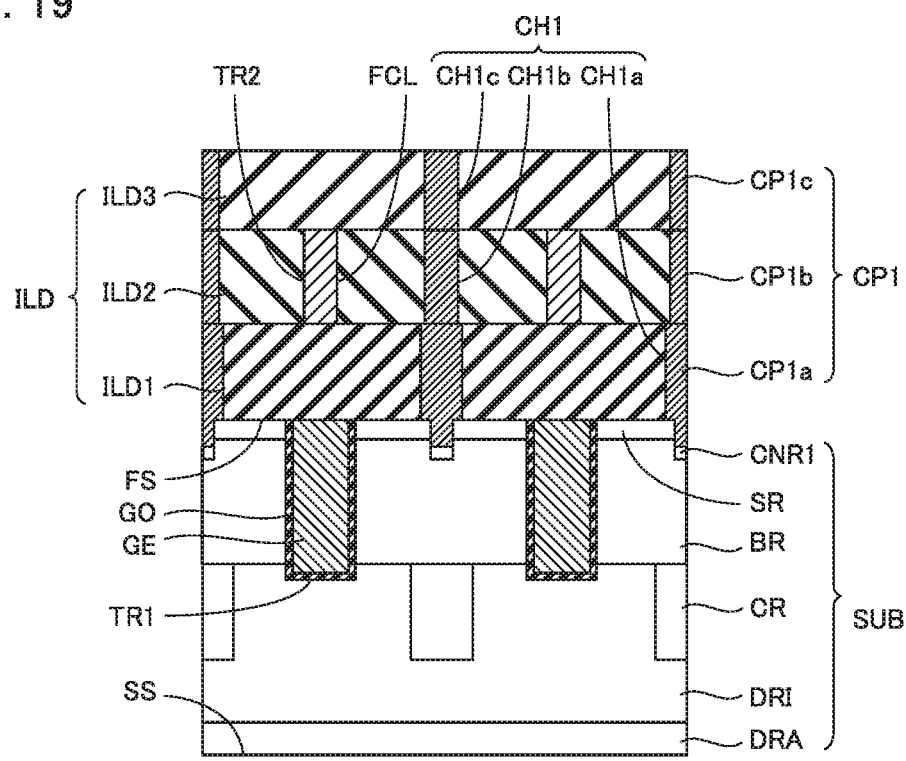
FIG. 19 is a cross-sectional view of the semiconductor device according to the first embodiment in the element region in a third contact plug forming step.
Figure 20:
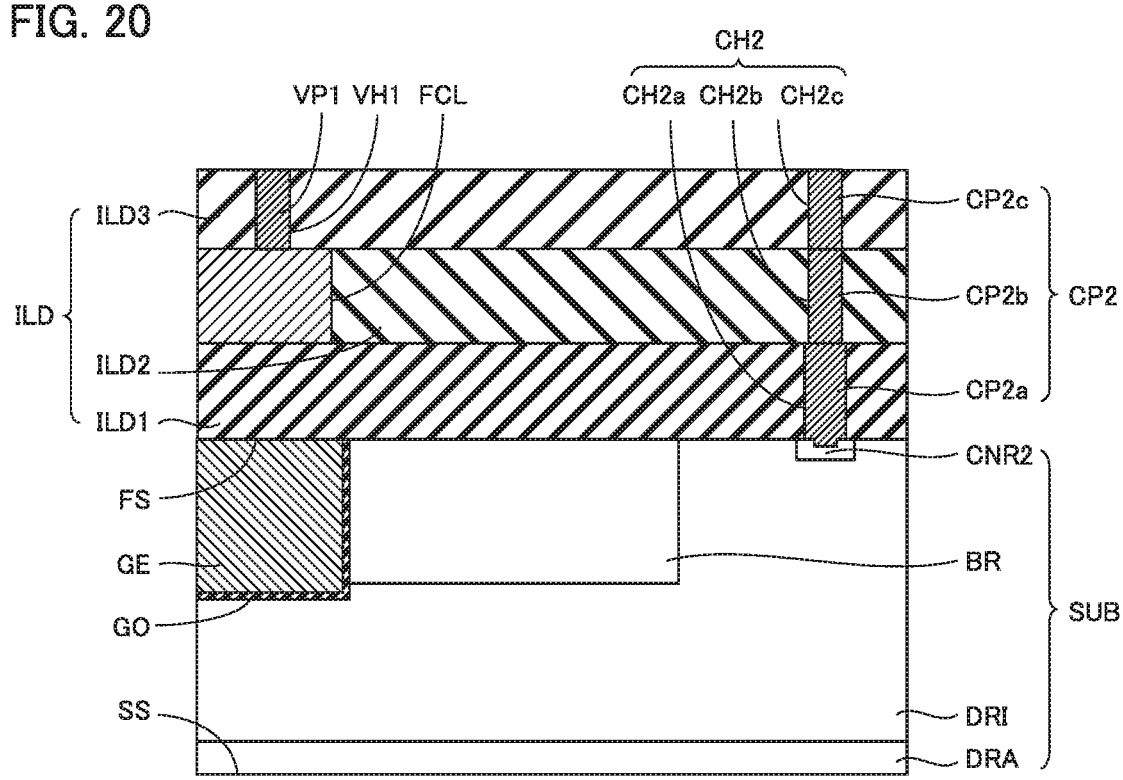
FIG. 20 is a cross-sectional view of the semiconductor device according to the first embodiment in the outer peripheral region in the third contact plug forming step.

As shown in FIGS. 19 and 20, in third contact plug forming step S26, third portion CP1c, third portion CP2c and via plug VP1 are formed. Although not shown in FIGS. 19 and 20, third portion CP3c is also formed in third contact plug forming step S26.

In third contact plug forming step S26, third portion CH1c, third portion CH2c, third portion CH3c, and via hole VH1 are first formed by performing anisotropic etching such as RIE on third interlayer insulating film ILD3. Secondly, the materials forming third portion CP1c, third portion CP2c, third portion CP3c, and via plug VP1 are embedded in third portion CH1c, third portion CH2c, third portion CH3c, and via hole VH1 by, for example, CVD.

Thirdly, the materials forming third portion CP1c, third portion CP2c, third portion CP3c, and via plug VP1 that have overflowed from third portion CH1c, third portion CH2c, third portion CH3c, and via hole VH1 are removed by, for example, CMP. Third portion CP1c, third portion CP2c, third portion CP3c, and via plug VP1 are thus formed.

In wiring forming step S27, first wiring WL1, second wiring WL2 and third wiring WL3 are formed. In wiring forming step S27, the materials forming first wiring WL1, second wiring WL2 and third wiring WL3 are first deposited by sputtering or the like. In wiring forming step S27, secondly, the deposited materials forming first wiring WL1, second wiring WL2 and third wiring WL3 are patterned by photolithography and etching. First wiring WL1, second wiring WL2 and third wiring WL3 are thus formed and the structure of the semiconductor device according to the first embodiment shown in FIGS. 1 to 4 is formed.

An effect of the semiconductor device according to the first embodiment will be described below.

First, a general effect of the semiconductor device according to the first embodiment will be described. In the semiconductor device according to the first embodiment, first conductive film FCL is insulated from and faces second wiring WL2. In addition, in the semiconductor device according to the first embodiment, first conductive film FCL is electrically connected to drain region DRA and second wiring WL2 is electrically connected to source region SR. That is, in the semiconductor device according to the first embodiment, source-drain capacitance C is disposed within element region ER in a plan view. Therefore, in the semiconductor device according to the first embodiment, it is unnecessary to increase a chip area in order to form the source-drain capacitance.

Since first conductive film FCL can be formed using, for example, a general process for forming a contact plug, formation of first conductive film FCL does not lead to complication of the process. Therefore, in the semiconductor device according to the first embodiment, an influence of noise can be reduced without complication of the process and increase in chip area.

Figure 21:
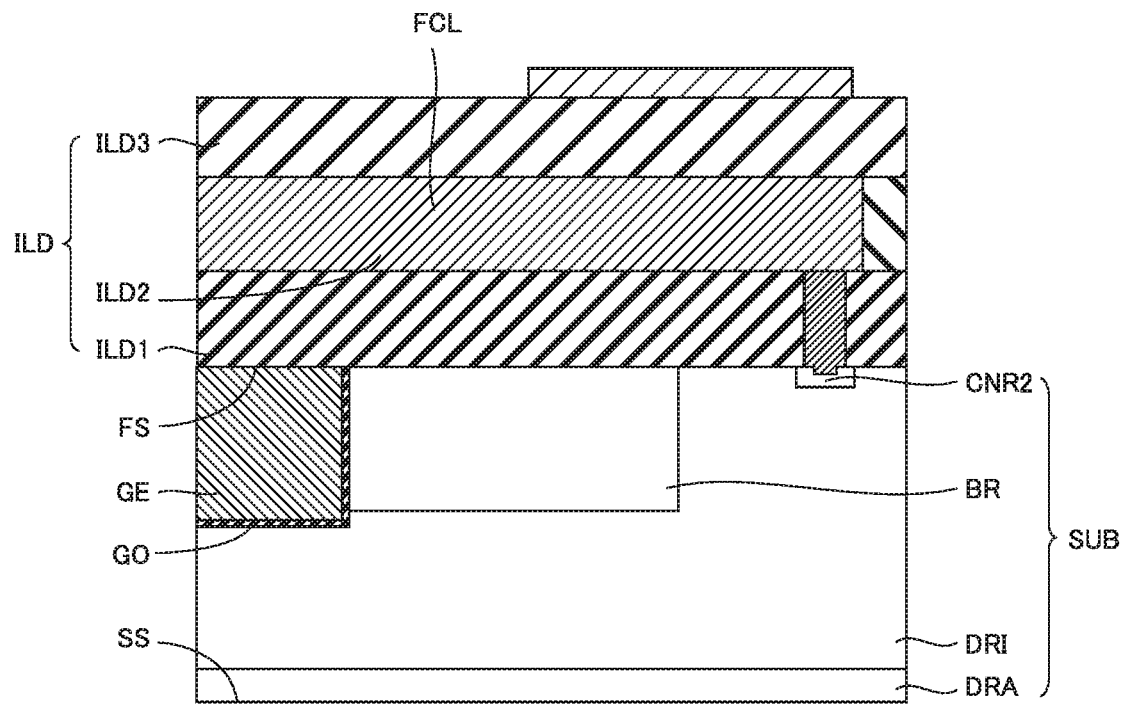
FIG. 21 is a cross-sectional view of a semiconductor device according to a comparative example near a boundary between a body region and a drift region.
Figure 22:
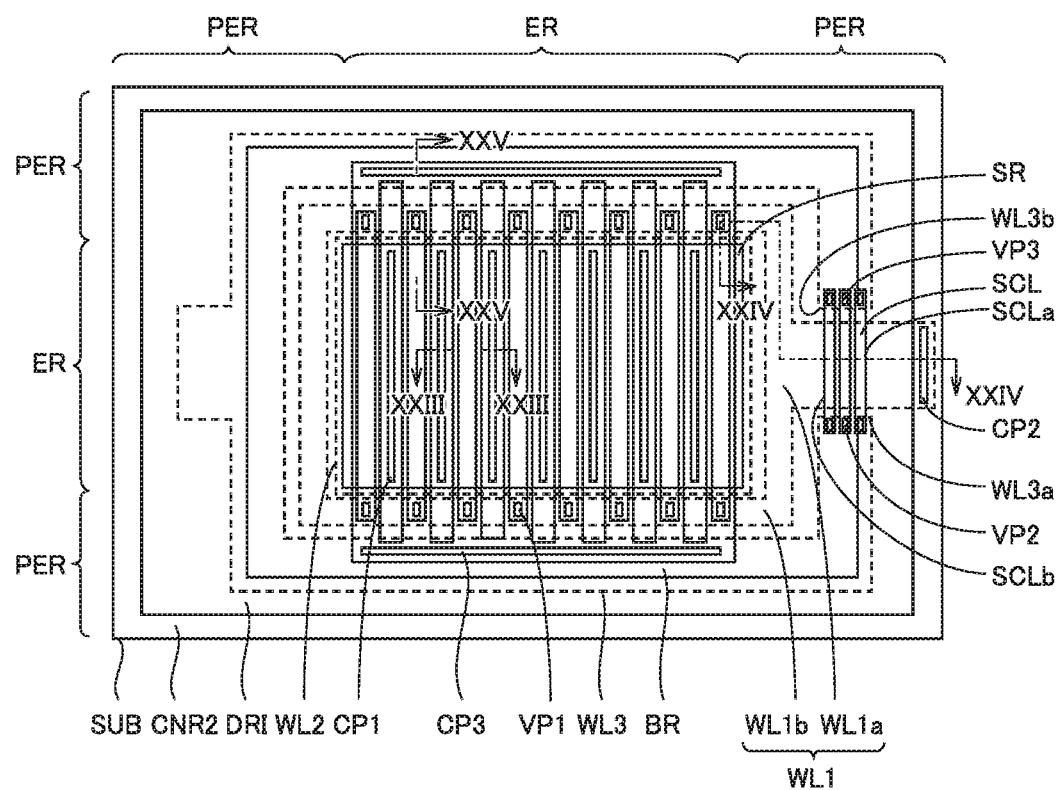
FIG. 22 is a top view of a semiconductor device according to a second embodiment.
Figure 23:
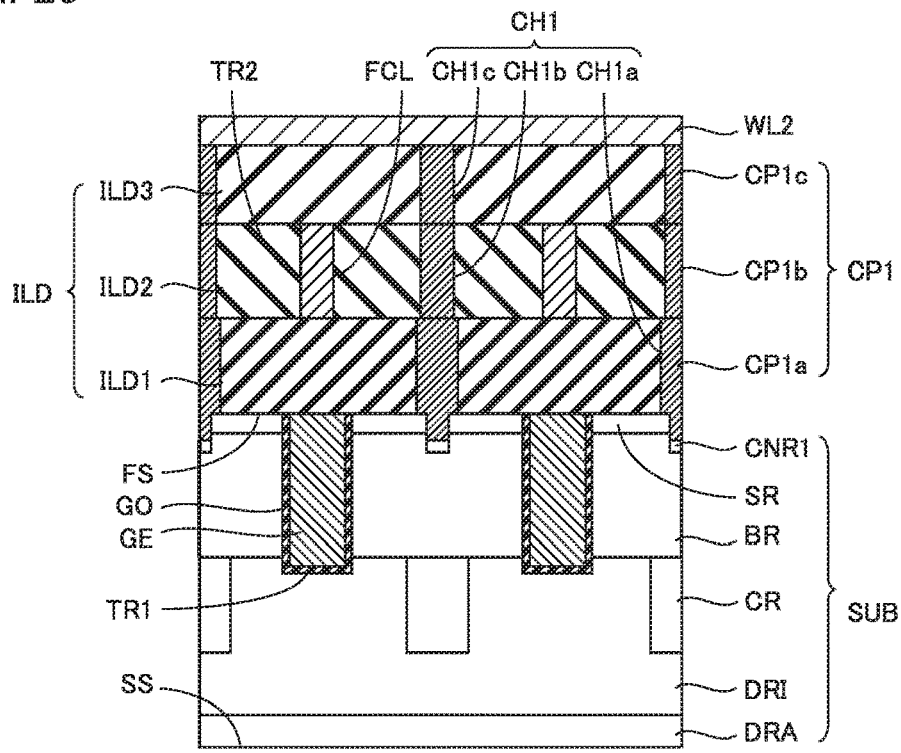
FIG. 23 is a cross-sectional view taken along line XXIII-XXIII in FIG. 22.
Figure 24:
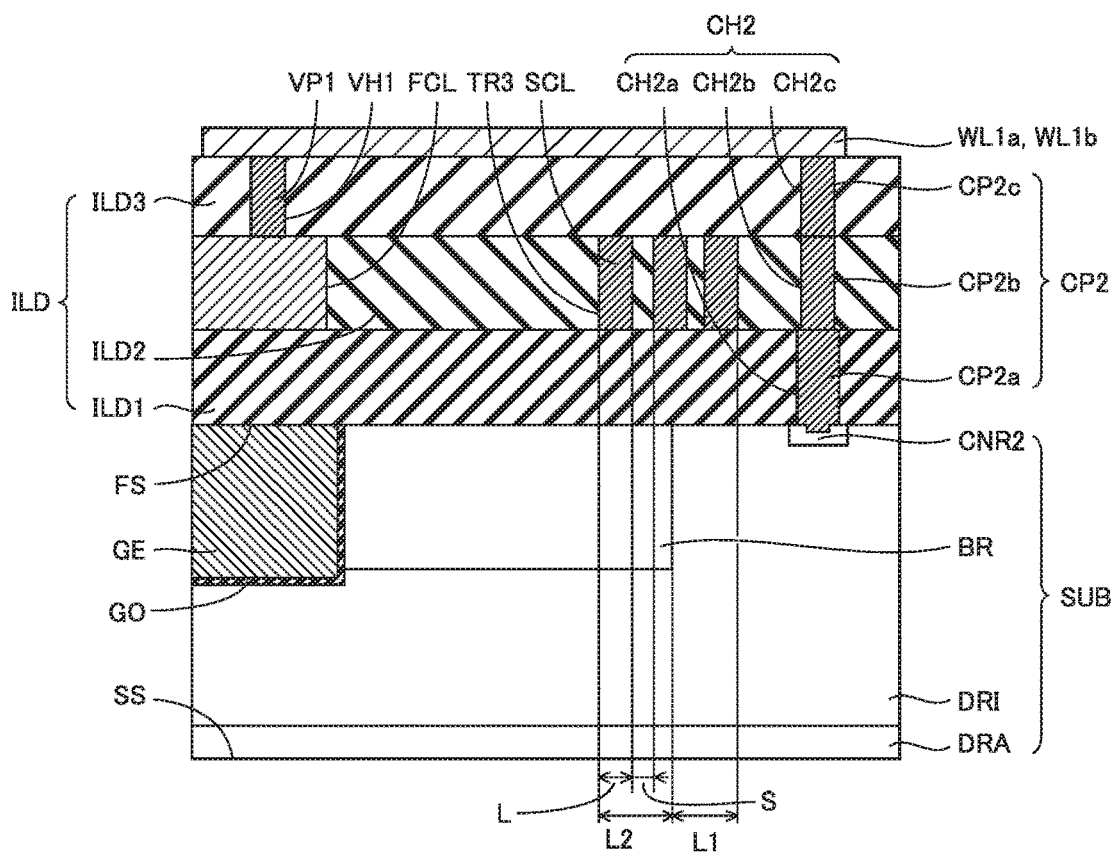
FIG. 24 is a cross-sectional view taken along line XXIV-XXIV in FIG. 22.
Figure 25:
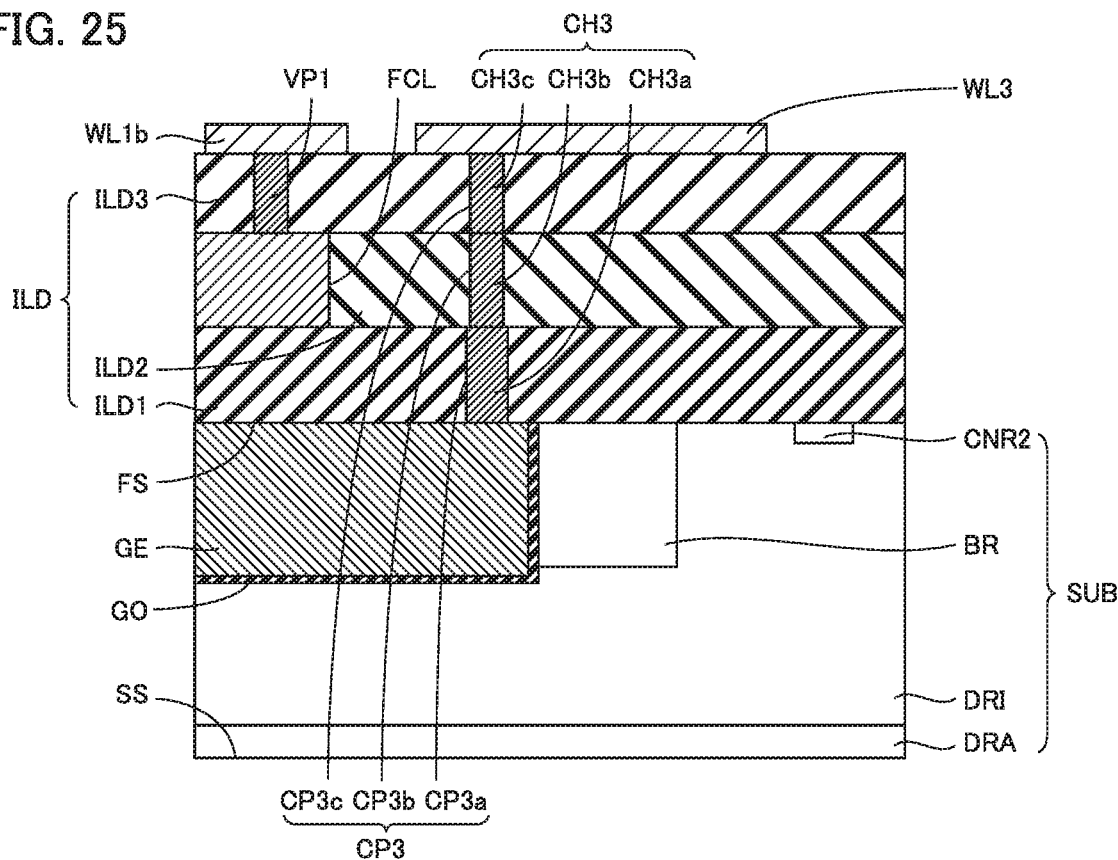
FIG. 25 is a cross-sectional view taken along line XXV-XXV in FIG. 22.
Figure 26:
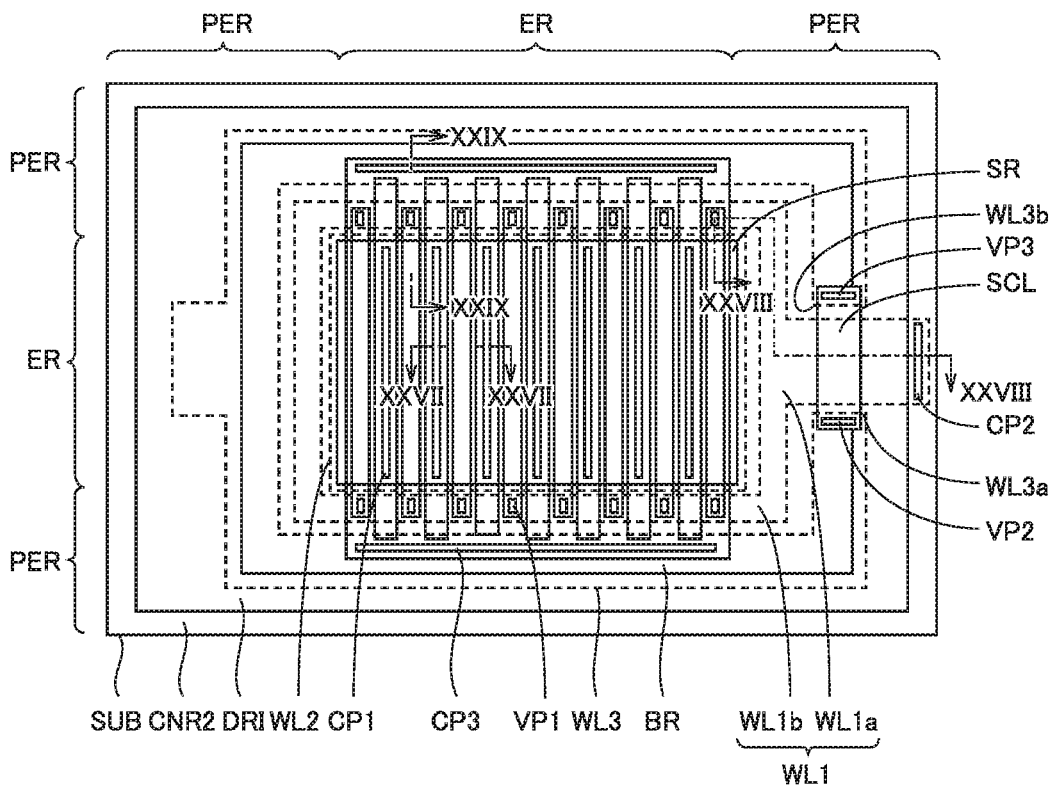
FIG. 26 is a top view of a semiconductor device according to a third embodiment.
Figure 27:
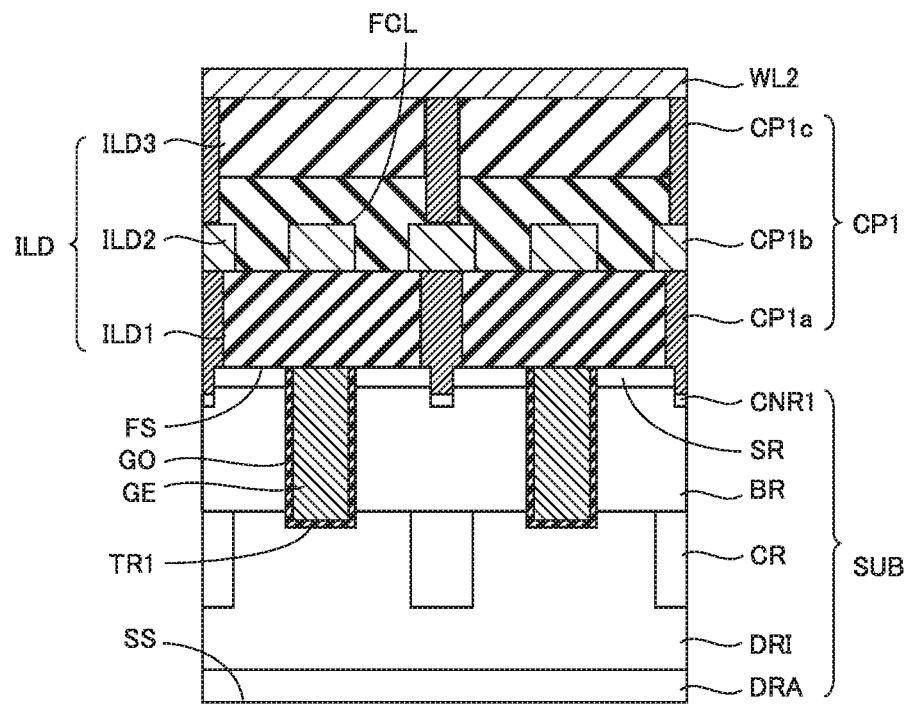
FIG. 27 is a cross-sectional view taken along line XXVII-XXVII in FIG. 26.
Figure 28:
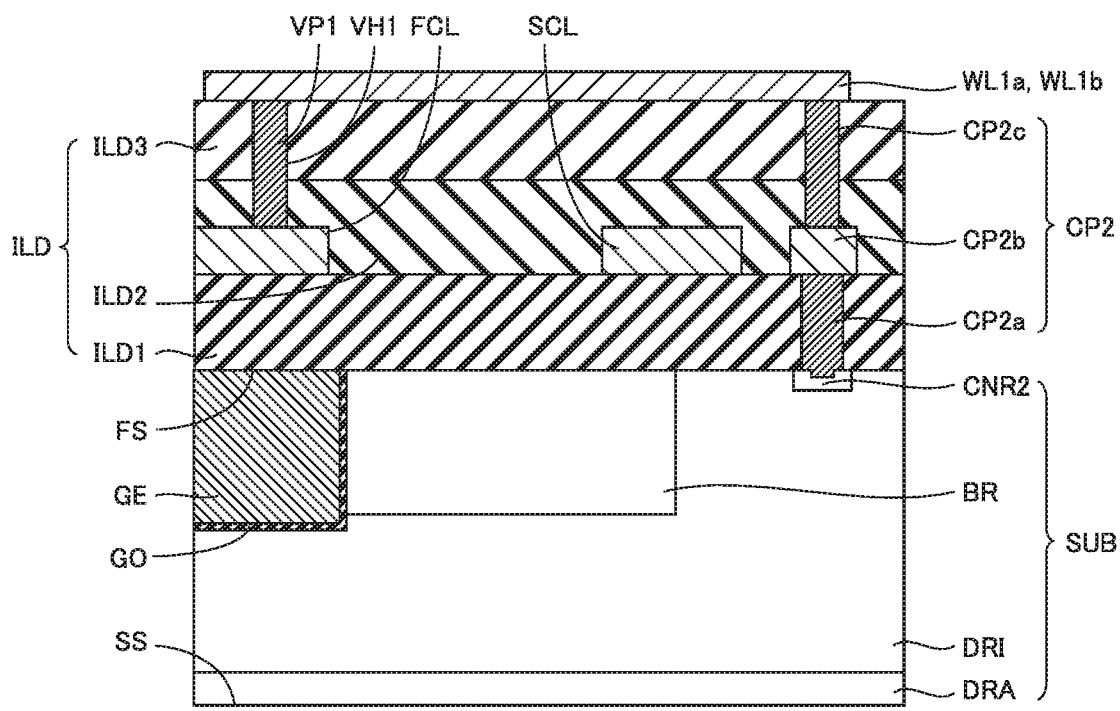
FIG. 28 is a cross-sectional view taken along line XXVIII-XXVIII in FIG. 26.
Figure 29:
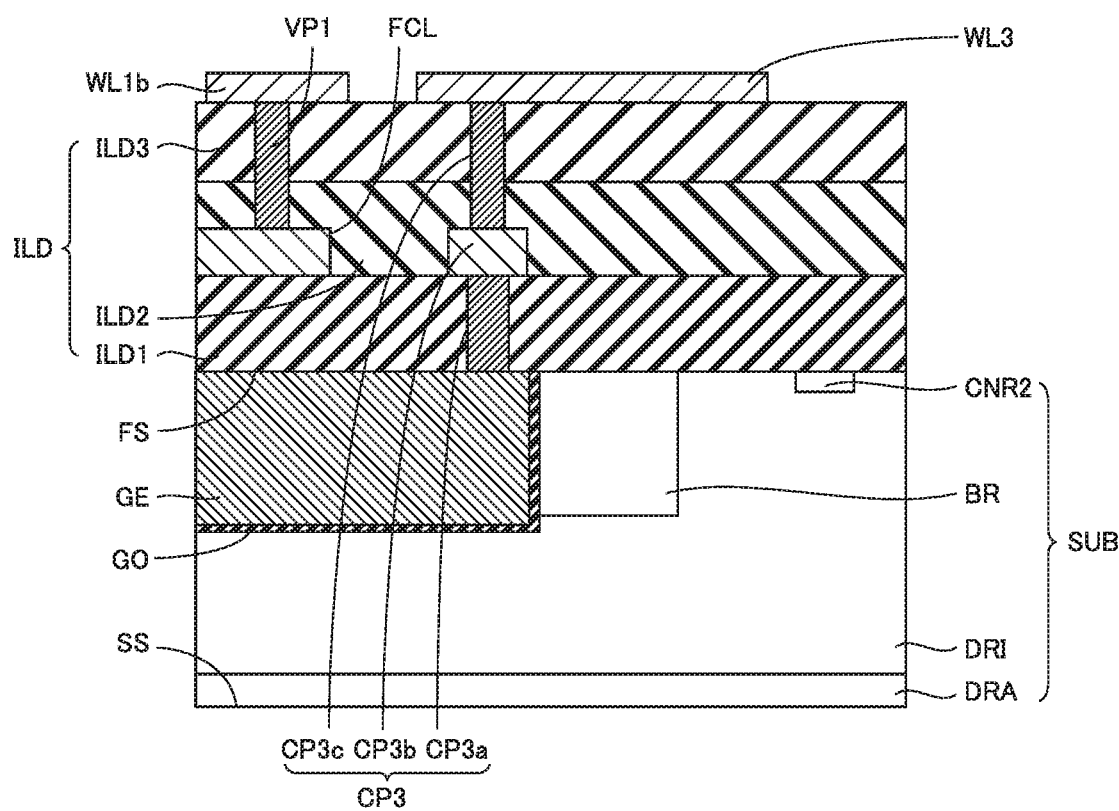
FIG. 29 is a cross-sectional view taken along line XXIX-XXIX in FIG. 26.

Next, a detailed effect of the semiconductor device according to the first embodiment will be described based on comparison with a comparative example. As shown in FIG. 21, in a semiconductor device according to the comparative example, first wiring WL1 does not have first portion WL1a. In addition, in the semiconductor device according to the comparative example, first conductive film FCL has a portion extending across a boundary between body region BR and drift region DRI and connected to contact region CNR2. The semiconductor device according to the comparative example is different from the semiconductor device according to the first embodiment in terms of these points.

An interface of a p-n junction between body region BR and drift region DRI is exposed to first surface FS. Therefore, a depletion layer caused by this p-n junction does not easily extend in first surface FS. In the semiconductor device according to the comparative example, first conductive film FCL extends across the boundary between body region BR and drift region DRI as described above. That is, in the semiconductor device according to the comparative example, a distance between first surface FS and the portion electrically connected to drain region DRA and extending across the boundary between body region BR and drift region DRI is relatively short. As a result, the depletion layer does not more easily extend due to an influence of a drain potential.

On the other hand, in the semiconductor device according to the first embodiment, first wiring WL1 has first portion WL1a. Since first portion WL1a extends across the boundary between body region BR and drift region DRI, first conductive film FCL is electrically connected to drain region DRA. Therefore, in the semiconductor device according to the first embodiment, a distance between first surface FS and the portion electrically connected to drain region DRA and extending across the boundary between body region BR and drift region DRI is relatively long. As a result, in the semiconductor device according to the first embodiment, the difficulty of extension of the depletion layer due to an influence of a drain potential is mitigated and an OFF breakdown voltage can be improved.

Furthermore, a more detailed effect of the semiconductor device according to the first embodiment will be described. Third wiring WL3 is insulated from first surface FS by interlayer insulating film ILD. Third wiring WL3 is disposed so as to extend across the boundary between body region BR and drift region DRI. Therefore, drift region DRI located at the boundary with body region BR, first interlayer insulating film ILD1 and second interlayer insulating film ILD2 located on drift region DRI, and third wiring WL3 form a MOS (Metal Oxide Semiconductor) structure.

Third wiring WL3 is electrically connected to gate electrode GE. Therefore, in an OFF state, third wiring WL3 is reversely biased with respect to drift region DRI located at the boundary with body region BR. As a result, the depletion layer easily extends to drift region DRI being adjacent to body region BR and located in first surface FS. That is, third wiring WL3 provides a field plate effect to drift region DRI located at the boundary with body region BR.

Therefore, in the semiconductor device according to the first embodiment, the OFF breakdown voltage can be further improved when third wiring WL3 extends across the boundary between body region BR and drift region DRI and extends along the boundary.

First conductive film FCL is embedded in trench TR2. Therefore, even if etching of trench TR2 and second portion CH1b is excessive or insufficient in second contact plug forming step S24, the insulation property is easily ensured between first conductive film FCL having a drain potential and second portion CP1b having a source potential, because second interlayer insulating film ILD2 remains between trench TR2 and second portion CH1b.

Second Embodiment

A structure of a semiconductor device according to a second embodiment will be described below. In the following description, the differences from the structure of the semiconductor device according to the first embodiment will be mainly described and redundant description will not be repeated.

As shown in FIGS. 22, 23, 24, and 25, the semiconductor device according to the second embodiment has semiconductor substrate SUB, gate insulating film GO, gate electrode GE, interlayer insulating film ILD, contact plug CP1, contact plug CP2, contact plug CP3, first wiring WL1, second wiring WL2, third wiring WL3, via plug VP1, and first conductive film FCL. In regard to this point, the semiconductor device according to the second embodiment is in common with the semiconductor device according to the first embodiment.

The semiconductor device according to the second embodiment further has a second conductive film SCL, a via plug VP2 and a via plug VP3. In regard to this point, the semiconductor device according to the second embodiment is different from the semiconductor device according to the first embodiment.

A trench TR3 is provided in second interlayer insulating film ILD2. Trench TR3 extends from a surface of second interlayer insulating film ILD2 on the third interlayer insulating film ILD3 side toward a surface of second interlayer insulating film ILD2 on the first interlayer insulating film ILD1 side. Trench TR3 may penetrate through second interlayer insulating film ILD2 in the thickness direction. Second conductive film SCL is embedded in trench TR3. Second conductive film SCL is made of, for example, W. From another point of view, second conductive film SCL is made of the material identical to that of first conductive film FCL and may be disposed in the layer identical to the layer in which first conductive film FCL is disposed.

Trench TR3 may preferably extend in a direction along a boundary between body region BR and drift region DRI. That is, second conductive film SCL may extend along the boundary between body region BR and drift region DRI.

A plurality of trenches TR3 may be provided. Trenches TR3 are spaced apart from one another in a direction intersecting with the boundary between body region BR and drift region DRI. Trench TR3 located closest to drift region DRI is disposed at a position overlapping with drift region DRI in a plan view. Trench TR3 located closest to body region BR is disposed at a position overlapping with body region BR in a plan view. That is, second conductive film SCL is disposed so as to extend across the boundary between body region BR and drift region DRI.

At the boundary between body region BR and drift region DRI, second conductive film SCL and first conductive film FCL may be disposed so as to overlap with each other in a plan view.

Trench TR3 has a width L. Width L refers to a distance between the side walls of trench TR3 facing each other in the direction intersecting with the boundary between body region BR and drift region DRI. Width L is preferably not less than 0.2 μm and not more than 0.4 μm.

Adjacent trenches TR3 are spaced apart from each other by a spacing S in the direction intersecting with the boundary between body region BR and drift region DRI. A value obtained by dividing width L by spacing S is preferably not less than 0.5 and not more than 1.

Second conductive film SCL has a first end SCLa and a second end SCLb. First end SCLa and second end SCLb are ends of second conductive film SCL in the direction intersecting with the boundary between body region BR and drift region DRI. First end SCLa is located at a position overlapping with drift region DRI in a plan view. Second end SCLb is located at a position overlapping with body region BR in a plan view. First end SCLa and the boundary between body region BR and drift region DRI are spaced apart from each other by a distance L1. Second end SCLb and the boundary between body region BR and drift region DRI are spaced apart from each other by a distance L2. Distance L1 is preferably not less than 3 µm. Distance L2 is preferably not less than 3 µm.

Second conductive film SCL is electrically connected to third wiring WL3. At third end WL3a, third wiring WL3 is connected to second conductive film SCL by via plug VP2. At fourth end WL3b, third wiring WL3 is connected to second conductive film SCL by via plug VP3. As a result, second conductive film SCL is electrically connected to third wiring WL3.

A method for manufacturing the semiconductor device according to the second embodiment will be described below. In the following description, the differences from the method for manufacturing the semiconductor device according to the first embodiment will be mainly described and redundant description will not be repeated.

The method for manufacturing the semiconductor device according to the second embodiment has front end step S1 and back end step S2. Back end step S2 has first interlayer insulating film forming step S21, first contact plug forming step S22, second interlayer insulating film forming step S23, second contact plug forming step S24, third interlayer insulating film forming step S25, third contact plug forming step S26, and wiring forming step S27. In regard to these points, the method for manufacturing the semiconductor device according to the second embodiment is in common with the method for manufacturing the semiconductor device according to the first embodiment.

The method for manufacturing the semiconductor device according to the second embodiment is different from the method for manufacturing the semiconductor device according to the first embodiment in terms of second contact plug forming step S24 and third contact plug forming step S26.

In second contact plug forming step S24, second conductive film SCL is formed in addition to second portion CP1b, second portion CP2b, second portion CP3b, and first conductive film FCL.

In the formation of second conductive film SCL, trench TR3 is first formed. Trench TR3 is formed by, for example, anisotropic etching such as RIE. Secondly, the material forming second conductive film SCL is embedded in trench TR3. The material forming second conductive film SCL is embedded in trench TR3 by, for example, CVD. Thirdly, the material forming second conductive film SCL that have overflowed from trench TR3 is removed. Second conductive film SCL is thus formed. Second conductive film SCL is preferably formed simultaneously with first conductive film FCL, second portion CP1b, second portion CP2b, and second portion CP3b.

In third contact plug forming step S26, via plug VP2 and via plug VP3 are formed in addition to third portion CP1c, third portion CP2c and via plug VP1. Via plug VP2 and via plug VP3 are formed using a method similar to a method for forming via plug VP1.

An effect of the semiconductor device according to the second embodiment will be described below. In the following description, the differences from the effect of the semiconductor device according to the first embodiment will be mainly described and redundant description will not be repeated.

Second conductive film SCL is insulated from first surface FS by first interlayer insulating film ILD1 and second interlayer insulating film ILD2. Second conductive film SCL is disposed so as to extend across the boundary between body region BR and drift region DRI. Therefore, drift region DRI located at the boundary with body region BR, and first interlayer insulating film ILD1 and second conductive film SCL located on drift region DRI form a MOS structure.

Second conductive film SCL is electrically connected to gate electrode GE. Therefore, in an OFF state, second conductive film SCL is reversely biased with respect to drift region DRI located at the boundary with body region BR. As a result, a depletion layer easily extends to drift region DRI located at the boundary with body region BR. That is, second conductive film SCL provides a field plate effect to drift region DRI located at the boundary with body region BR. Therefore, in the semiconductor device according to the second embodiment, an OFF breakdown voltage can be further improved.

When width L is less than 0.2 µm, the process condition for forming trenches TR3 may be severe in some cases. When width L exceeds 0.4 µm, the material forming second conductive film SCL needs to be deposited thick in order to embed the material forming second conductive film SCL in trench TR3, and thus, the process time becomes longer. Therefore, when width L is not less than 0.2 µm and not more than 0.4 µm, the efficiency of the manufacturing process can be enhanced.

When the value obtained by dividing width L by spacing S is less than 0.5, the spacing between adjacent trenches TR3 is large, and thus, the field plate effect provided by second conductive film SCL is relatively small. When the value obtained by dividing width L by spacing S exceeds 1, the spacing between adjacent trenches TR3 is small, and thus, the process condition for forming trenches TR3 may be severe in some cases. Therefore, when the value obtained by dividing width L by spacing S is not less than 0.5 and not more than 1, the efficiency of the manufacturing process can be enhanced and the OFF breakdown voltage can be improved.

When distance L1 and distance L2 are not less than 3 µm, it is possible to ensure a width of the MOS structure formed by drift region DRI located at the boundary with body region BR, first interlayer insulating film ILD1 and second interlayer insulating film ILD2 located on drift region DRI, and second conductive film SCL, in the direction intersecting with the boundary between body region BR and drift region DRI. Therefore, in this case, the OFF breakdown voltage can be further improved.

When second conductive film SCL is disposed so as to overlap with first portion WL1a in a plan view, second conductive film SCL shields an influence of a drain potential caused by first portion WL1a. Therefore, in this case, the OFF breakdown voltage can be further improved.

When second conductive film SCL extends along the boundary between body region BR and drift region DRI, the MOS structure formed by drift region DRI located at the boundary with body region BR, first interlayer insulating film ILD1 and second interlayer insulating film ILD2 located on drift region DRI, and second conductive film SCL is formed along the boundary between body region BR and drift region DRI. That is, the field plate effect provided by second conductive film SCL is offered along the boundary between body region BR and drift region DRI. Therefore, in this case, the OFF breakdown voltage can be further improved.

When third wiring WL3 is connected to second conductive film SCL by via plug VP2 and via plug VP3 at third end WL3a and fourth end WL3b, a gate potential can be supplied to second conductive film SCL and a wiring resistance of third wiring WL3 can be reduced.

Third Embodiment

A structure of a semiconductor device according to a third embodiment will be described below. In the following description, the differences from the semiconductor device according to the second embodiment will be mainly described and redundant description will not be repeated.

As shown in FIGS. 26, 27, 28, and 29, the semiconductor device according to the third embodiment has semiconductor substrate SUB, gate insulating film GO, gate electrode GE, and interlayer insulating film ILD. The semiconductor device according to the third embodiment has contact plug CP1, contact plug CP2, contact plug CP3, first wiring WL1, second wiring WL2, third wiring WL3, via plug VP1, via plug VP2, via plug VP3, first conductive film FCL, and second conductive film SCL. In regard to these points, the semiconductor device according to the third embodiment is in common with the semiconductor device according to the second embodiment.

The semiconductor device according to the third embodiment is different from the semiconductor device according to the second embodiment in terms of details of a structure of second conductive film SCL.

Second conductive film SCL is disposed on first interlayer insulating film ILD1. Second conductive film SCL is integrally formed. Second conductive film SCL is made of, for example, Al, an Al alloy or the like. The material of second conductive film SCL is preferably identical to the material of first conductive film FCL and the material of second portion CP1b, second portion CP2b and second portion CP3b.

A method for manufacturing the semiconductor device according to the third embodiment will be described below. In the following description, the differences from the method for manufacturing the semiconductor device according to the second embodiment will be mainly described and redundant description will not be repeated.

The method for manufacturing the semiconductor device according to the third embodiment has front end step S1 and back end step S2. Back end step S2 has first interlayer insulating film forming step S21, first contact plug forming step S22, second interlayer insulating film forming step S23, second contact plug forming step S24, third interlayer insulating film forming step S25, third contact plug forming step S26, and wiring forming step S27. In regard to these points, the method for manufacturing the semiconductor device according to the third embodiment is in common with the method for manufacturing the semiconductor device according to the second embodiment.

In the method for manufacturing the semiconductor device according to the third embodiment, second contact plug forming step S24 is performed after first contact plug forming step S22 and before second interlayer insulating film forming step S23. In regard to this point, the method for manufacturing the semiconductor device according to the third embodiment is different from the method for manufacturing the semiconductor device according to the second embodiment.

In second contact plug forming step S24, second portion CP1b, second portion CP2b, second portion CP3b, first conductive film FCL, and second conductive film SCL are formed. In second contact plug forming step S24, the materials forming second portion CP1b, second portion CP2b, second portion CP3b, first conductive film FCL, and second conductive film SCL are first deposited by sputtering or the like. Secondly, the deposited materials forming second portion CP1b, second portion CP2b, second portion CP3b, first conductive film FCL, and second conductive film SCL are patterned by photolithography and etching. Second portion CP1b, second portion CP2b, second portion CP3b, first conductive film FCL, and second conductive film SCL are thus formed.

An effect of the semiconductor device according to the third embodiment will be described below. In the following description, the differences from the effect of the semiconductor device according to the second embodiment will be mainly described and redundant description will not be repeated.

In the semiconductor device according to the third embodiment, second conductive film SCL is integrally formed, and thus, the field plate effect provided by second conductive film SCL can be further enhanced as compared with the semiconductor device according to the second embodiment in which second conductive film SCL is divided into a plurality of portions. Therefore, in the semiconductor device according to the third embodiment, the OFF breakdown voltage can be further improved.

Although the embodiments of the present invention have been described above, the embodiments disclosed herein are illustrative and not limitative in any respect. The scope of the present invention is defined by the terms of the claims, and is intended to include any modifications within the scope and meaning equivalent to the terms of the claims.

What is claimed is:

1. A semiconductor device comprising:
   a semiconductor substrate having a first surface and a second surface which is an opposite surface of the first surface;
   a first wiring and a second wiring disposed on the first surface;
   a first conductive film electrically connected to the first wiring; and
   a gate electrode,
   the semiconductor substrate having a source region of a first conductivity type located in the first surface, a drain region of the first conductivity type located in the second surface, a drift region of the first conductivity type located on the drain region, and a body region of a second conductivity type sandwiched between the source region and the drift region, the second conductivity type being a conductivity type opposite to the first conductivity type,
   the drift region being disposed so as to surround the body region in a plan view,
   the first wiring having a first portion disposed so as to extend across a boundary between the drift region and the body region in a plan view, and electrically connected to the drift region,
   the gate electrode being insulated from and facing the body region sandwiched between the source region and the drift region, the second wiring being electrically connected to the source region, the first conductive film being insulated from and facing the second wiring, wherein the first conductive film has one end portion which is terminated on the gate electrode, and the first wiring is connected with the one end portion of the first conductive film.

2. The semiconductor device according to claim 1, further comprising a second conductive film disposed so as to extend across the boundary and electrically connected to the gate electrode.

3. The semiconductor device according to claim 2, wherein the second conductive film extends along the boundary.

4. The semiconductor device according to claim 2, wherein the second conductive film is disposed so as to overlap with the first portion in a plan view.

5. The semiconductor device according to claim 2, wherein the second conductive film has a first end located on the drain region and a second end which is an opposite end of the first end, a distance between the boundary and the first end is not less than 3 µm, and a distance between the boundary and the second end is not less than 3 µm.

6. The semiconductor device according to claim 2, wherein the first conductive film and the second conductive film are located in an identical layer and are made of an identical material.

7. The semiconductor device according to claim 2, further comprising a third wiring disposed on the first surface and electrically connected to the gate electrode, wherein the third wiring extends across the boundary and extends along the boundary, the third wiring has a third end and a fourth end spaced apart from the third end, and the first portion passes between the third end and the fourth end in a plan view.

8. The semiconductor device according to claim 7, wherein the third wiring is electrically connected to the second conductive film at the third end and the fourth end.

9. The semiconductor device according to claim 2, further comprising an interlayer insulating film disposed on the first surface, wherein at least one or more trenches having the second conductive film embedded therein are provided in the interlayer insulating film.

10. The semiconductor device according to claim 9, wherein a plurality of the trenches are provided, and a value obtained by dividing a width of the trench by a spacing between the trenches adjacent to each other is not less than 0.5 and not more than 1.

11. The semiconductor device according to claim 10, wherein the width of the trench is not less than 0.2 µm and not more than 0.4 µm.

12. The semiconductor device according to claim 2, wherein the second conductive film is integrally formed.

* * * * *